United States Patent
Park

(10) Patent No.: US 11,101,017 B2
(45) Date of Patent: Aug. 24, 2021

(54) MEMORY SYSTEM AND TEST SYSTEM

(71) Applicant: SK hynix Inc., Gyeonggi-do (KR)

(72) Inventor: Jeen Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 4 days.

(21) Appl. No.: 16/528,042

(22) Filed: Jul. 31, 2019

(65) Prior Publication Data

US 2020/0152286 A1 May 14, 2020

(30) Foreign Application Priority Data

Nov. 13, 2018 (KR) .................. 10-2018-0138709

(51) Int. Cl.
*G11C 29/46* (2006.01)
*G11C 29/44* (2006.01)
*G06F 11/36* (2006.01)
*G11C 11/409* (2006.01)

(52) U.S. Cl.
CPC .......... *G11C 29/46* (2013.01); *G06F 11/3684* (2013.01); *G11C 11/409* (2013.01); *G11C 29/44* (2013.01)

(58) Field of Classification Search
CPC ....... G11C 29/46; G11C 29/44; G11C 11/409; G11C 29/08; G11C 29/56; G11C 29/18; G11C 2029/1802; G06F 11/3684
USPC ......................................................... 714/720
See application file for complete search history.

(56) References Cited

U.S. PATENT DOCUMENTS

| | | | | |
|---|---|---|---|---|
| 5,509,018 A * | 4/1996 | Niijima | ................. | G11C 16/16 365/185.09 |
| 5,802,069 A * | 9/1998 | Coulson | ................ | G06F 3/0601 714/6.13 |
| 9,009,561 B2 * | 4/2015 | Pereira | ................ | G06F 11/1012 714/758 |
| 9,009,565 B1 * | 4/2015 | Northcott | .............. | G06F 11/108 714/763 |
| 2003/0074650 A1 * | 4/2003 | Akgul | ................. | G06F 11/3624 717/129 |
| 2005/0204234 A1 * | 9/2005 | Bacigalupo | ............ | G11C 29/18 714/733 |
| 2008/0244340 A1 * | 10/2008 | Doi | ........................ | G11C 29/81 714/711 |
| 2012/0179946 A1 * | 7/2012 | Chakravarty | .. | G01R 31/318544 714/733 |

FOREIGN PATENT DOCUMENTS

KR 101561854 10/2015

* cited by examiner

*Primary Examiner* — James C Kerveros
(74) *Attorney, Agent, or Firm* — IP & T Group LLP

(57) ABSTRACT

A memory system includes a memory device including a test region; and a processor configured to write pattern data transferred from a host device to a pattern data region included in the test region, read test data from the test region, and transmit the read test data to the host device. A position of the pattern data region may be adjustable in the test region.

21 Claims, 7 Drawing Sheets

MEMORY SYSTEM AND TEST SYSTEM

CROSS-REFERENCES TO RELATED APPLICATION

The present application claims priority under 35 U.S.C. § 119(a) to Korean application number 10-2018-0138709, filed on Nov. 13, 2018, which is incorporated herein by reference in its entirety.

BACKGROUND

1. Technical Field

Various embodiments generally relate to a memory system, and more particularly, to a memory system including a memory device.

2. Related Art

A memory system typically stores data provided from a host device, in response to a write request of the host device. Furthermore, the memory system also provides the stored data to the host device, in response to a read request of the host device. The host device, which is an electronic device capable of processing data, may include a computer, a digital camera, a mobile phone, or the like. The memory system may be installed and operated in the host device, or manufactured in the separable form and operated by being coupled to the host device.

SUMMARY

Various embodiments may provide a memory system and a test system including the same, capable of effectively detecting an error position in a memory device during a test operation.

In an embodiment, a memory system may include: a memory device including a test region; and a processor configured to write pattern data transferred from a host device to a pattern data region included in the test region, read test data from the test region, and transmit the read test data to the host device. A position of the pattern data region may be adjustable in the test region.

In an embodiment, a test system may include: a memory system including a processor and a memory device; and a host device configured to transmit pattern data to the memory system, receive test data from the memory system, and perform a test operation. The processor may write the pattern data to a pattern data region included in a test region of the memory device, read the test data from the test region, and transmit the read test data to the host device. A position of the pattern data region may be adjustable in the test region.

In an embodiment, a memory system comprising: a memory device including a test region; and a processor that: receives a test write request including tag data and pattern data from a host device; controls the memory device to store the tag data in start and end portions of the test region and the pattern data in a portion defined within the test region based on location information included in the tag data; and provides the stored data from the test region to the host device to determine integrity of the portion where the pattern data is stored, wherein the host device adjusts the location information whenever providing the test write request.

DETAILED DESCRIPTION

Figure 1:
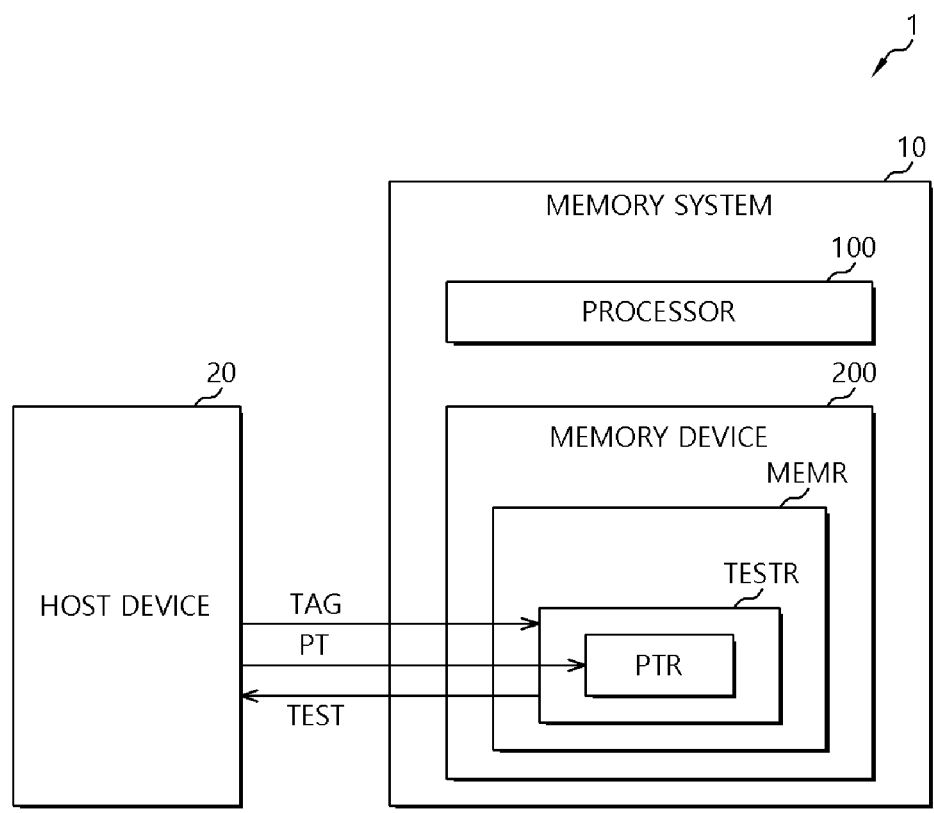
FIG. 1 is a block diagram illustrating a test system including a memory system in accordance with an embodiment.

Advantages and features of the present disclosure, and implementation methods thereof will be described in more detail through following embodiments described with reference to the accompanying drawings. The present disclosure may, however, be embodied in different forms and should not be construed as limited to the embodiments set forth herein. Rather, these embodiments are provided so that the present disclosure will be thorough and complete, and will fully convey the technical spirit of the disclosure to those skilled in the art.

It is noted that reference to "an embodiment," "another embodiment" or the like does not necessarily mean only one embodiment, and different references to any such phrase are not necessarily to the same embodiment(s).

In the drawings, various embodiments of the present disclosure are not limited to the illustrated specific forms. For example, the drawings may have been exaggerated for the purpose of clarity. Although specific terms have been used in the present specification, they are used in order to describe the present disclose and are not used in order to limit the meaning or the scope of the present disclosure, which is disclosed in the appended claims.

In the specification, "and/or" means that it includes at least one of listed components. It will be understood that when an element is referred to as being "connected" or "coupled" to another element, it can be directly connected or coupled to the other element or intervening elements may be present. The terms of a singular form may include plural forms unless specifically mentioned. The articles 'a' and 'an' as used in this specification and the appended claims should generally be construed to mean 'one or more' unless specified otherwise or clear from context to be directed to a singular form. It will be further understood that the terms "comprises or includes" and/or "comprising or including" when used in this specification, specify the presence of stated features, integers, steps, operations, elements, and/or components, but do not preclude the presence or addition of one or more other features, integers, steps, operations, elements, components, and/or groups thereof.

Hereinafter, embodiments will be described in detail with reference to the accompanying drawings.

FIG. 1 is a block diagram illustrating a test system 1 including a memory system 10 in accordance with an embodiment.

The test system 1 may include the memory system 10 and a host device 20.

The host device 20 may control overall operations of the memory system 10. The host device 20 may transmit a write request to the memory system 10 to store data in the memory system 10, and transmit a read request to the memory system 10 to read the data from the memory system 10.

Furthermore, the host device 20 may perform a test operation on a memory device 200 by controlling the memory system 10. In detail, the test operation may be performed on a test region TESTR included in the memory device 200, under control of the host device 20.

When the test operation is performed, the host device 20 may transmit pattern data PT to the memory system 10. The pattern data PT may be, for example, random data. In another example, the pattern data PT may be data that has a predetermined pattern and has been previously stored in the host device 20. As will be described below, during the test operation, the pattern data PT may be written to a pattern data region PTR included in the test region TESTR.

The host device 20 may receive, from the memory system 10, test data TEST read from the test region TESTR. Since the test data TEST includes pattern data read from the pattern data region PTR, the host device 20 may detect an error position in the pattern data region PTR based on the test data TEST.

In detail, the host device 20 may compare, for each bit, the pattern data PT that has been transmitted to the memory system 10 with the pattern data PT that is included in the test data TEST received from the memory system 10. The host device 20 may detect bits having different pattern data as errors through the comparison. A detected error may be a bit-flipped error which has occurred at an error position in the pattern data region PTR. Subsequently, a bit read at the corresponding error position may be corrected and then processed, or use of the error position of the pattern data region PTR may be excluded.

The host device 20 may further transmit tag data TAG to the memory system 10 during the test operation. The tag data TAG may include, for example, a logical address corresponding to the pattern data PT.

The tag data TAG may be written to regions of the test region TESTR except the pattern data region PTR, for example, to tag data regions that are disposed at a start position and an end position of the test region TESTR. Therefore, the tag data TAG may be included in the test data TEST and transmitted to the host device 20. The host device 20 may determine the start and end of the test data TEST by identifying the tag data TAG included in the test data TEST.

In an embodiment, as will be described in detail below, the tag data TAG may be used to determine the position of the pattern data region PTR in the test region TESTR. As a method of determining the position of the pattern data region PTR using the tag data TAG, the same method may be pre-arranged between the host device 20 and the memory system 10. Hence, the host device 20 may identify which part of the test data TEST is the pattern data PT, based on the tag data TAG included in the test data TEST, and may determine the error position included in the pattern region PTR, based on the recognized pattern data PT, according to the above-mentioned method.

Furthermore, the tag data TAG may be used to change the pattern data region PTR in the test region TESTR. In other words, the pattern data region PTR may be moved in the test region TESTR by changing the tag data TAG. Here, if the pattern data region PTR moves in the test region TESTR, the position of the pattern data read from the pattern data region PTR may accordingly move in the test data TEST. Nonetheless, the host device 20 may still identify which part of the test data TEST is the pattern data PT, based on the tag data TAG. The host device 20 may determine the error position included in the pattern data region PTR moved based on the identified pattern data PT, according to the above-mentioned method.

That is, in accordance with an embodiment, when the test operation is performed, the pattern data region PTR, where the error position is detected, is a part of the test region TESTR, but the position of the pattern data region PTR may change in the test region TESTR. Therefore, the host device 20 may thoroughly detect error positions which are distributed in the test region TESTR.

Furthermore, when the test operation is performed, debugging data of the memory system 10 may be further written to a region of the test region TESTR except the pattern data region PTR. Therefore, the debugging data may be included in the test data TEST and transmitted to the host device 20. The host device 20 may debug an internal operation of the memory system 10 based on the debugging data.

The memory system 10 may be configured to store data provided from the host device 20, in response to a write request of the host device 20. Furthermore, the memory system 10 may be configured to provide data to the host device 20, in response to a read request of the host device 20. Particularly, as will be described in detail below, the memory system 10 may perform a test operation on the test region TESTR under control of the host device 20.

The memory system 10 may be configured with a Personal Computer Memory Card International Association (PCMCIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD) and the like.

The memory system 10 may include a processor 100 and the memory device 200.

The processor 100 may control overall operations of the memory system 10. Particularly, the processor 100 may perform a test operation on the memory device 200 under control of the host device 20.

In detail, the processor 100 may write pattern data PT transferred from the host device 20 to the pattern data region PTR of the memory device 200.

The processor 100 may write tag data TAG and debugging data to a region of the test region TESTR except the pattern data region PTR. The debugging data may include a result of performing the internal operation by the processor 100.

Next, the processor 100 may read the test data TEST from the entirety of the test region TESTR and transmit the read test data TEST to the host device 20.

As described above, the pattern data region PTR may move in the test region TESTR. For example, with respect to two test operations on the same test region TESTR, a pattern data region PTR of the first test operation may differ from a pattern data region PTR of the second test operation. Hence, as the test operations are repeatedly performed while the pattern data regions PTR are changed, error positions in the test region TESTR may be detected without omission.

A detailed method of changing the pattern data regions PTR may be pre-arranged with the host device 20. For example, the processor 100 may determine an offset value based on the tag data TAG, and determine each pattern data region PTR in the test region TESTR based on the offset value. Hence, when the tag data TAG changes, the pattern data region PTR may also change.

In an embodiment, the position of the test region TESTR in a memory region MEMR may also be shifted each time the test operation is repeatedly performed. Hence, error positions in the memory region MEMR may be detected without omission.

In an embodiment, the memory system 10 may include one or more nonvolatile memory devices (not illustrated). When a test operation is performed, the processor 100 may perform various internal operations on the nonvolatile memory devices using the pattern data PT. The processor 100 may store, as debugging data, a result of performing the internal operations on the nonvolatile memory devices in a region of the test region TESTR except the pattern data region PTR.

In an embodiment, the test region TESTR may have a size corresponding to one logical address. For example, in the case where the host device 20 allocates each logical address to data of 4 KB, the processor 100 may select a test region TESTR such that the test region TESTR has a size of 4 KB.

The memory device 200 may perform a function of a working memory, a buffer memory, a cache memory, or the like of the processor 100. The memory device 200 may store, as a working memory, various program data and a software program which is driven by the processor 100. The memory device 200 may buffer, as a buffer memory, data which is transmitted between the host device 20 and the memory system 10. The memory device 200 may temporarily store cache data as a cache memory.

The memory device 200 may include a memory region MEMR. The memory region MEMR may be a region in which data is to be stored.

The memory device 200 may be a volatile memory device or a nonvolatile memory device. The volatile memory device may include a Dynamic Random Access Memory (DRAM), a Static Random Access Memory (SRAM), and the like. The nonvolatile memory device may include a flash memory, such as a NAND flash or a NOR flash, a Ferro-electrics Random Access Memory (FeRAM), a Phase-Change Random Access Memory (PCRAM), a Magnetoresistive Random Access Memory (MRAM), a Resistive Random Access Memory (ReRAM), and the like.

Figure 2:
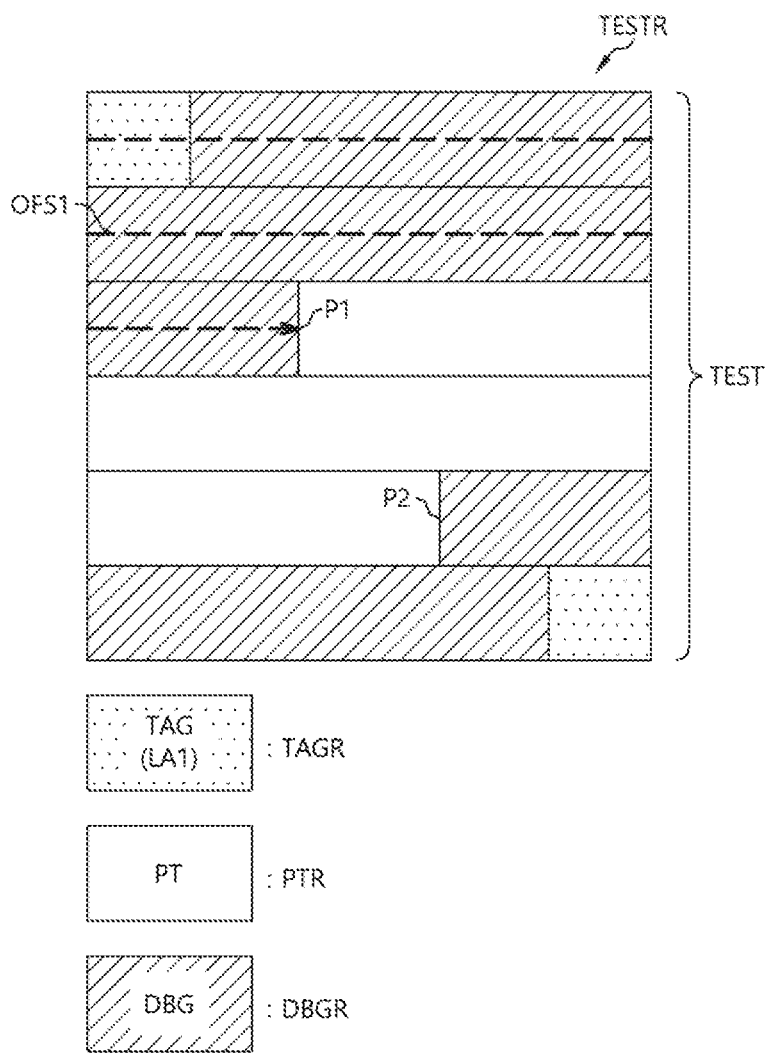
FIG. 2 is a diagram illustrating a method of performing a test operation on a test region in accordance with an embodiment.

FIG. 2 is a diagram illustrating a method of performing a test operation on the test region TESTR of FIG. 1, in accordance with an embodiment. For instance, FIG. 2 illustrates that the test region TESTR is a block including six rows.

Referring to FIG. 2, the memory system 10 may receive a tag data TAG and pattern data PT from the host device 20.

The processor 100 may write the tag data TAG to at least one tag data region TAGR of the test region TESTR. For example, the tag data region TAGR may be present at each of a start position and an end position of the test region TESTR.

The tag data TAG may include a logical address LA1 corresponding to the pattern data PT. In other words, the memory system 10 may use the logical address LA1 as the tag data TAG when receiving the pattern data PT and the logical address LA1 corresponding to the pattern data PT together from the host device 20.

When the test data TEST is read from the test region TESTR and transmitted to the host device 20, the tag data TAG included in the test data TEST may enable the host device 20 to identify the start and end of the test data TEST. Therefore, in an embodiment, the tag data TAG may use any data pre-arranged between the host device 20 and the memory system 10, instead of the logical address LA1 corresponding to the pattern data PT.

Then, the processor 100 may determine an offset value OFS1 based on the tag data TAG, and determine the pattern data region PTR based on the offset value OFS1. For example, the pattern data region PTR may start from a position P1 obtained by adding the offset value OFS1 to the start position of the test region TESTR. In FIG. 2, the position P1 obtained by adding the offset value OFS1 to the start position is calculated on the assumption that memory cells of the rows are arranged in a sequence from the top to the bottom to form, for example, to form six rows, and memory cells in each row are arranged in a sequence from the left to the right within the test region TESTR.

Since the pattern data PT has a predetermined size, if the start position P1 of the pattern data region PTR is determined, an end position P2 of the pattern data region PTR may also be determined. The processor 100 may write the pattern data PT to the determined pattern data region PTR.

Furthermore, the processor 100 may determine a debugging data region DBGR in the test region TESTR, and write debugging data DBG to the debugging data region DBGR. When the entire test data TEST is formed of the tag data TAG, the pattern data PT, and the debugging data DBG, the debugging data region DBGR may be a remaining region of the test region TESTR except the tag data region TAGR and the pattern data region PTR.

In detail, the debugging data region DBGR may start from the end position P2 of the pattern data region PTR in the test region TESTR. In addition, the debugging data DBG may be generated to have a predetermined size. Hence, if the start position P2 of the debugging data region DBGR is determined, the end position P1 of the debugging data region DBGR may also be determined. For example, since the entire test region TESTR has a predetermined size, as illustrated in FIG. 2, the debugging data region DBGR may extend from a rear part of the test region TESTR to a front part thereof, and end at the start position P1 of the pattern data region PTR.

In the embodiment described above, the pattern data region PTR is determined, and then the debugging data region DBGR is determined based on the pattern data region PTR. However, according to another embodiment, the sequence in which the pattern data region PTR and the debugging data region DBGR are determined may be reversed. In other words, as illustrated in FIG. 2, the debugging data region DBGR may be determined based on the offset value OFS1, and then the pattern data region PTR may be determined based on the debugging data region DBGR.

The processor 100 may determine the offset value OFS1 based on the tag data TAG and a predetermined key. The key may be a value pre-arranged or pre-recognized and stored between the processor 100 and the host device 20. For example, the processor 100 may determine the offset value OFS1 by performing an XOR operation on the tag data TAG and the key. In this case, as will be described with reference to FIG. 3, when the tag data TAG changes, the offset value may change. Furthermore, when the offset value changes, the pattern data region PTR may change in the test region TESTR.

Figure 3:
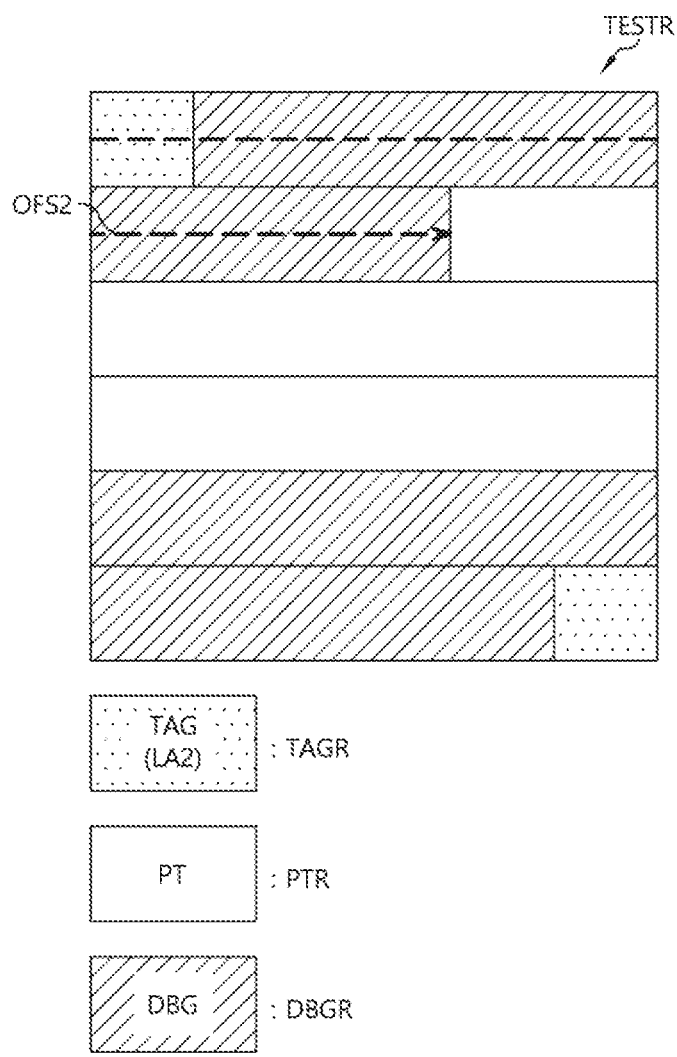
FIG. 3 is a diagram illustrating a change in a position of a pattern data region in the test region from the position in FIG. 2, in accordance with an embodiment.

FIG. 3 is a diagram illustrating a change in position of the pattern data region PTR in the test region TESTR from the position in FIG. 2, in accordance with an embodiment.

Referring to FIG. 3, during a test operation different from that of FIG. 2, the memory system 10 may receive a logical address LA2 when receiving pattern data PT from the host device 20. The logical address LA2 may be used as tag data TAG. The logical address LA2 may differ from the logical address LA1 of FIG. 2. Therefore, the processor 100 may determine an offset value OFS2 different from the offset value OFS1 of FIG. 2, based on the logical address LA2 and the predetermined key.

The processor 100 may determine a pattern data region PTR based on the offset value OFS2. Compared to FIG. 2, since the offset value OFS2 changed, the pattern data region PTR may also change in the test region TESTR. Therefore, when a certain error position is present in the pattern data region PTR of FIG. 3, even if the corresponding error position has not been detected during the test operation of FIG. 2, it may be detected during the test operation of FIG. 3.

A method of determining the debugging data region DBGR in FIG. 3 is similar to that described with reference to FIG. 2; therefore, further explanation thereof will be omitted.

Figure 4:
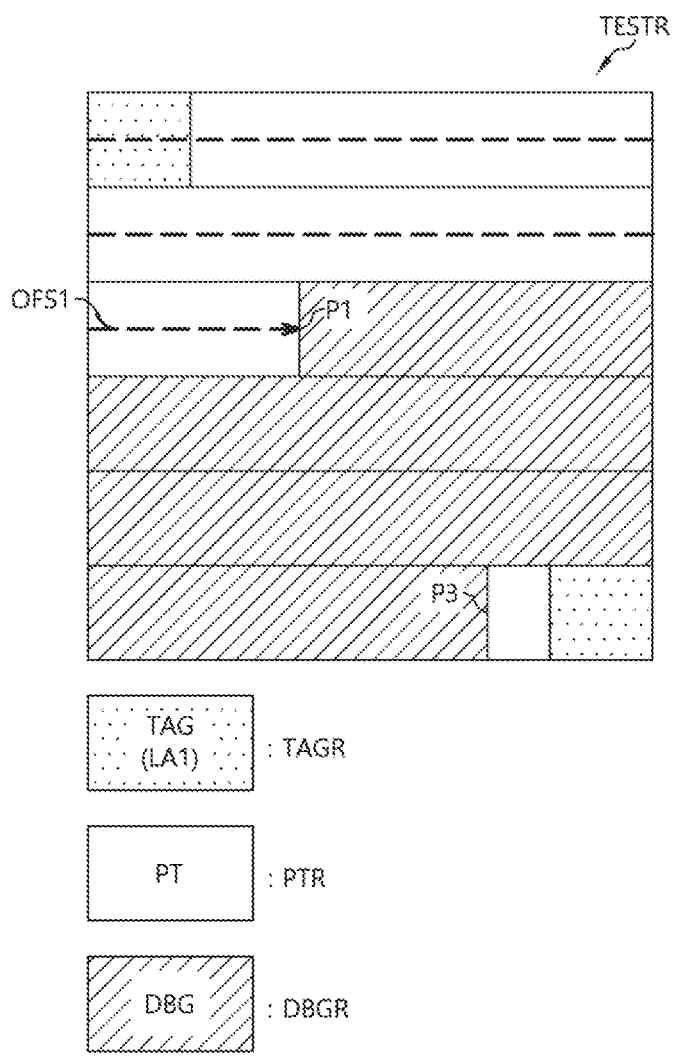
FIG. 4 is a diagram illustrating another method of determining a pattern data region and a debugging data region in the test region in accordance with an embodiment.

FIG. 4 is a diagram illustrating another method of determining the pattern data region PTR and the debugging data region DBGR in the test region TESTR in accordance with an embodiment. In FIG. 4, the pattern data region PTR and the debugging data region DBGR may be determined in a manner opposite to that of FIG. 2.

Referring to FIG. 4, the memory system 10 may receive, for example, the same logical address LA1 as that of FIG. 2 from the host device 20, and use the logical address LA1 as the tag data TAG. Hence, the processor 100 may determine the same offset value OFS1 as that of FIG. 2, based on the tag data TAG.

The processor 100 may determine the debugging data region DBGR based on the offset value OFS1 determined by the tag data TAG. For example, the debugging data region DBGR may start from a position P1 obtained by adding the offset value OFS1 to a start position of the test region TESTR. If the start position P1 of the debugging data region DBGR is determined, an end position P3 of the debugging data region DBGR may also be determined based on the size of the debugging data DBG.

The pattern data region PTR may start from the end position P3 of the debugging data region DBGR in the test region TESTR. In this case, the pattern data region PTR may end at the start position P1 of the debugging data region DBGR. In other words, the pattern data region PTR may end at the position P1 obtained by adding the offset value OFS1 to the start position of the test region TESTR.

Comparing the embodiments of FIGS. 2 and 4, the position P1 based on the offset value OFS1 in FIG. 2 may be the start position of the pattern data region PTR, and the position P1 in FIG. 4 may be the start position of the debugging data region DBGR. If any one of the pattern data region PTR and the debugging data region DBGR is determined based on the position P1, the other one may be automatically determined.

Although the test operations of FIGS. 2 to 4 use the same pattern data PT and generate the same debugging data DBG, the test operations may use different pattern data and generate different debugging data in some embodiments.

Figure 5:
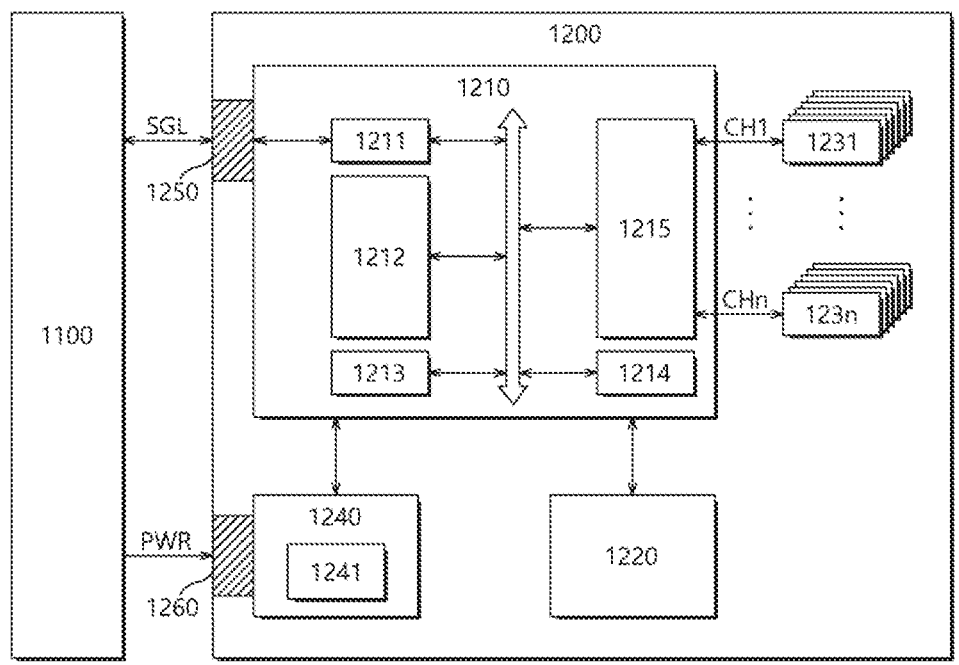
FIG. 5 is a diagram illustrating a data processing system including a solid state drive (SSD) in accordance with an embodiment.

FIG. 5 is a diagram illustrating a data processing system 1000 including a solid state drive (SSD) 1200 in accordance with an embodiment. Referring to FIG. 5, the data processing system 1000 may include a host device 1100 and the SSD 1200.

The SSD 1200 may include a controller 1210, a buffer memory device 1220, a plurality of nonvolatile memory devices 1231 to 123n, a power supply 1240, a signal connector 1250, and a power connector 1260.

The controller 1210 may control general operations of the SSD 1200. The controller 1210 may include a host interface 1211, a control device 1212, a random access memory 1213, an error correction code (ECC) circuit 1214, and a memory interface 1215.

The host interface 1211 may exchange a signal SGL with the host device 1100 through the signal connector 1250. The signal SGL may include a command, an address, data, and so forth. The host interface 1211 may interface the host device 1100 and the SSD 1200 according to the protocol of the host device 1100. For example, the host interface 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-e or PCIe) and universal flash storage (UFS).

The control device 1212 may analyze and process the signal SGL received from the host device 1100. The control device 1212 may control operations of internal function blocks according to a firmware or a software for driving the SSD 1200. The random access memory 1213 may be used as a working memory for driving such a firmware or software.

The control device 1212 may include the processor 100 shown in FIG. 1. The control device 1212 may operate in the same manner as the processor 100 shown in FIG. 1. The random access memory 1213 may include the memory device 200 shown in FIG. 1.

The ECC circuit 1214 may generate the parity data of data to be transmitted to at least one of the nonvolatile memory devices 1231 to 123n. The generated parity data may be stored together with the data in the nonvolatile memory devices 1231 to 123n. The ECC circuit 1214 may detect an error of the data read from at least one of the nonvolatile memory devices 1231 to 123n, based on the parity data. If a detected error is within a correctable range, the ECC circuit 1214 may correct the detected error.

The memory interface 1215 may provide control signals such as commands and addresses to at least one of the nonvolatile memory devices 1231 to 123n, according to control of the control device 1212. Moreover, the memory interface 1215 may exchange data with at least one of the nonvolatile memory devices 1231 to 123n, according to control of the control device 1212. For example, the memory interface 1215 may provide the data stored in the buffer memory device 1220, to at least one of the nonvolatile memory devices 1231 to 123n, or provide the data read from at least one of the nonvolatile memory devices 1231 to 123n, to the buffer memory device 1220.

The buffer memory device 1220 may temporarily store data to be stored in at least one of the nonvolatile memory devices 1231 to 123*n*. Further, the buffer memory device 1220 may temporarily store the data read from at least one of the nonvolatile memory devices 1231 to 123*n*. The data temporarily stored in the buffer memory device 1220 may be transmitted to the host device 1100 or at least one of the nonvolatile memory devices 1231 to 123*n* according to control of the controller 1210.

The nonvolatile memory devices 1231 to 123*n* may be used as storage media of the SSD 1200. The nonvolatile memory devices 1231 to 123*n* may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 6:
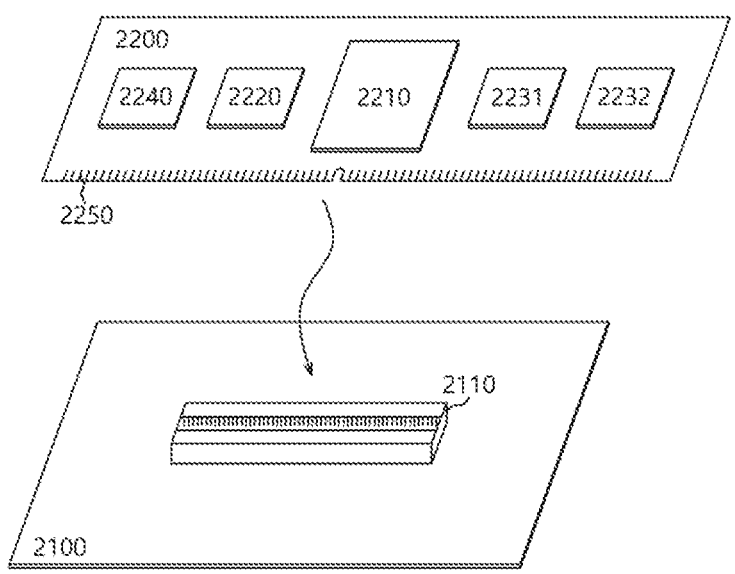
FIG. 6 is a diagram illustrating a data processing system including a memory system in accordance with an embodiment.

FIG. 6 is a diagram illustrating a data processing system 2000 including a memory system 2200 in accordance with an embodiment. Referring to FIG. 6, the data processing system 2000 may include a host device 2100 and the memory system 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control general operations of the memory system 2200. The controller 2210 may be configured in the same manner as the controller 1210 shown in FIG. 5.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the memory system 2200.

The PMIC 2240 may provide the power inputted through the connection terminal 2250, to the inside of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the memory system 2200. The connection terminal 2250 may be configured into various types depending on an interface scheme between the host device 2100 and the memory system 2200. The connection terminal 2250 may be disposed on any one side of the memory system 2200.

Figure 7:
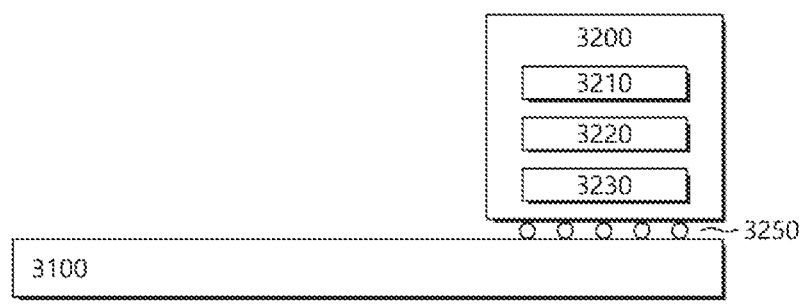
FIG. 7 is a diagram illustrating a data processing system including a memory system in accordance with an embodiment.

FIG. 7 is a diagram illustrating a data processing system 3000 including a memory system 3200 in accordance with an embodiment. Referring to FIG. 7, the data processing system 3000 may include a host device 3100 and the memory system 3200.

The host device 3100 may be configured in the form of a board such as a printed circuit board. Although not shown, the host device 3100 may include internal function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control general operations of the memory system 3200. The controller 3210 may be configured in the same manner as the controller 1210 shown in FIG. 5.

The buffer memory device 3220 may temporarily store data to be stored in the nonvolatile memory device 3230. Further, the buffer memory device 3220 may temporarily store the data read from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 8:
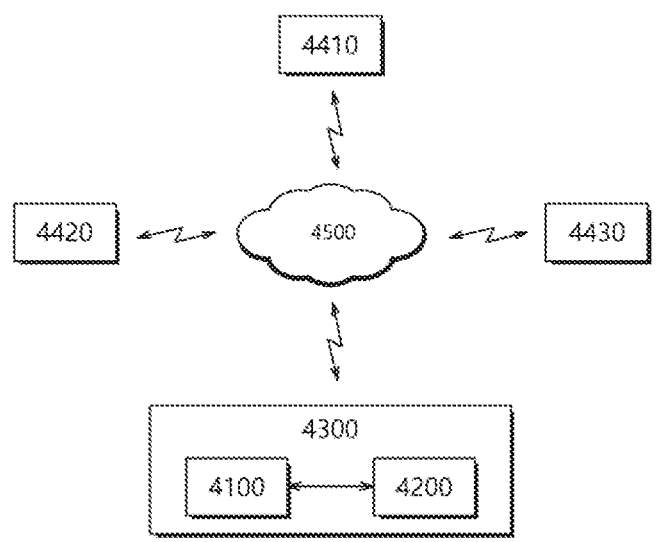
FIG. 8 is a diagram illustrating a network system including a memory system in accordance with an embodiment.

FIG. 8 is a diagram illustrating a network system 4000 including a memory system 4200 in accordance with an embodiment. Referring to FIG. 8, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the memory system 10 shown in FIG. 1, the memory system SSD shown in FIG. 5, the memory system 2200 shown in FIG. 6 or the memory system 3200 shown in FIG. 7.

Figure 9:
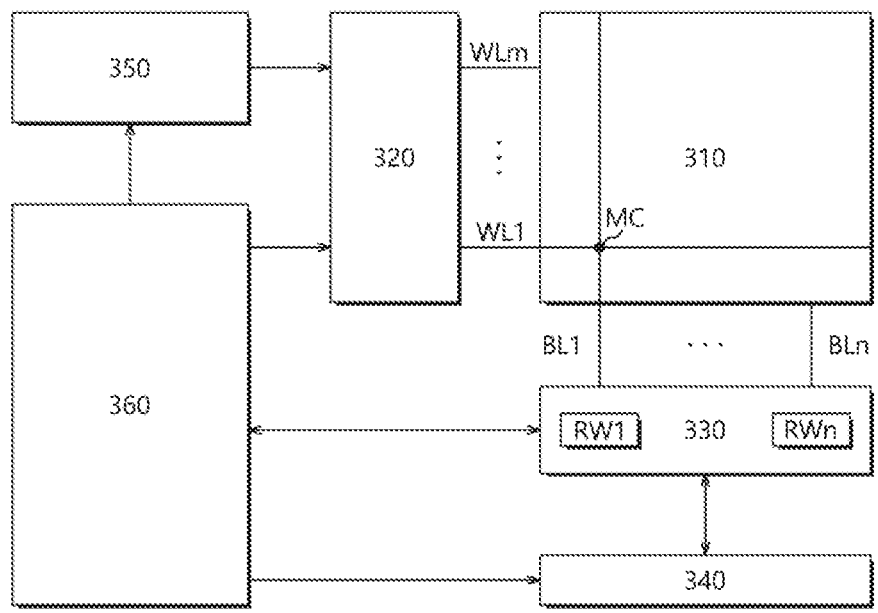
FIG. 9 is a block diagram illustrating a nonvolatile memory device included in a memory system in accordance with an embodiment.

FIG. 9 is a block diagram illustrating a nonvolatile memory device 300 included in a memory system in accordance with an embodiment. Referring to FIG. 9, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

As described above, a memory system and a test system including the memory system in accordance with an embodiment may effectively detect an error position in the memory device during a test operation.

While various embodiments have been described above, it will be understood to those skilled in the art that the embodiments described are by way of example only. Accordingly, the memory system described herein should not be limited based on the described embodiments. Rather, the memory system having the same described herein should only be limited in light of the claims that follow when taken in conjunction with the above description and accompanying drawings.

What is claimed is:

1. A memory system comprising:
    a memory device including a test region including a tag data region; and
    a processor configured to write tag data transferred from a host device to the tag data region, determine a position of a pattern data region in the test region based on the tag data, write pattern data transferred from the host device to the pattern data region, write, as debugging data, a result of performing an internal operation to a debugging data region included in the test region, read the tag data, the pattern data, and the debugging data from the test region as test data, and transmit the test data to the host device,
    wherein the position of the pattern data region is adjustable in the test region based on the tag data.

2. The memory system according to claim 1, wherein the processor determines an offset value based on the tag data, and determines the position of the pattern data region based on the offset value.

3. The memory system according to claim 2, wherein the tag data includes a logical address corresponding to the pattern data.

4. The memory system according to claim 2, wherein the tag data region is present at a start position of the test region.

5. The memory system according to claim 4, wherein the tag data region is present at an end position of the test region.

6. The memory system according to claim 2, wherein the processor determines the offset value based on the tag data and a predetermined key.

7. The memory system according to claim 2, wherein the processor determines a position of the debugging data region in the test region based on the tag data region and the pattern data region.

8. The memory system according to claim 7,
    wherein the pattern data region starts from a position obtained by adding the offset value to a start position of the test region, and
    wherein the processor determines, as the debugging data region, a region of the test region except the tag data region and the pattern data region.

9. The memory system according to claim 1, wherein the processor determines an offset value based on the tag data, determines a position of the debugging data region in the test region based on the offset value.

10. The memory system according to claim 9,
    wherein the debugging data region starts from a position obtained by adding the offset value to a start position of the test region, and
    wherein the processor determines, as the pattern data region, a region of the test region except the tag data region and the debugging data region.

11. A test system comprising:
    a memory system including a processor and a memory device; and
    a host device configured to transmit tag data and pattern data to the memory system, receive test data from the memory system, and perform a test operation,
    wherein the processor writes the tag data to a tag data region included in a test region of the memory device, determines a position of a pattern data region in the test region based on the tag data, writes the pattern data to the pattern data region, writes, as debugging data, a result of performing an internal operation to a debugging data region included in the test region, reads the tag data, the pattern data, and the debugging data from the test region as the test data, and transmits the test data to the host device, and wherein the position of the pattern data region is adjustable in the test region based on the tag data.

12. The test system according to claim 11, wherein the processor determines an offset value based on the tag data, and determines the position of the pattern data region based on the offset value.

13. The test system according to claim 12, wherein the tag data includes a logical address corresponding to the pattern data.

14. The test system according to claim 12, wherein the tag data region is present at a start position of the test region.

15. The test system according to claim 14, wherein the tag data region is present at an end position of the test region.

16. The test system according to claim 12, wherein the processor determines the offset value based on the tag data and a predetermined key.

17. The test system according to claim 12, wherein the processor determines a position of the debugging data region in the test region based on the tag data region and the pattern data region.

18. The test system according to claim 17,
wherein the pattern data region starts from a position obtained by adding the offset value to a start position of the test region, and wherein the processor determines, as the debugging data region, a region of the test region except the tag data region and the pattern data region.

19. The test system according to claim 11, wherein the processor determines an offset value based on the tag data, determines a position of the debugging data region in the test region based on the offset value.

20. The test system according to claim 19,
wherein the debugging data region starts from a position obtained by adding the offset value to a start position of the test region, and wherein the processor determines, as the pattern data region, a region of the test region except the tag data region and the debugging data region.

21. The test system according to claim 12, wherein the host device identifies the tag data from the test data received from the memory system, determines the offset value based on the recognized tag data, recognizes, from the test data, pattern data read from the pattern data region based on the determined offset value, and detects an error position from the pattern data region by comparing the recognized pattern data with the pattern data transmitted to the memory system.

* * * * *